(12) United States Patent
Andideh et al.

(10) Patent No.: US 6,914,335 B2
(45) Date of Patent: Jul. 5, 2005

(54) SEMICONDUCTOR DEVICE HAVING A LOW-K DIELECTRIC LAYER

(75) Inventors: Ebrahim Andideh, Portland, OR (US); Qing Ma, San Jose, CA (US); Quan Tran, San Jose, CA (US); Steve Towle, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 599 days.

(21) Appl. No.: 10/038,343

(22) Filed: Jan. 2, 2002

(65) Prior Publication Data

US 2002/0068469 A1 Jun. 6, 2002

Related U.S. Application Data

(62) Division of application No. 09/524,766, filed on Mar. 14, 2000, now Pat. No. 6,362,091.

(51) Int. Cl.[7] .............................................. H01L 29/40
(52) U.S. Cl. ........................ 257/760; 257/759; 257/522
(58) Field of Search ................................. 257/760–759, 257/776, 750, 522; 438/632–634

(56) References Cited

U.S. PATENT DOCUMENTS

| | | | |
|---|---|---|---|
| 5,886,410 A | 3/1999 | Chiang et al. | |
| 6,037,668 A | 3/2000 | Cave et al. | |
| 6,103,616 A | 8/2000 | Yu et al. | |
| 6,114,259 A | 9/2000 | Sukharev et al. | |
| 6,184,142 B1 | 2/2001 | Chung et al. | |
| 6,383,917 B1 * | 5/2002 | Cox | 438/637 |
| 6,737,725 B2 * | 5/2004 | Grill et al. | 257/522 |

* cited by examiner

Primary Examiner—Dung A. Le
(74) Attorney, Agent, or Firm—Micheal D. Plimier

(57) ABSTRACT

An improved semiconductor device is described. That semiconductor device includes a first insulating layer, having a low-k dielectric constant that preferably comprises a carbon doped oxide, that is formed on a substrate. The device further includes a second layer, which is formed on the first layer, that has a relatively high dielectric constant and superior mechanical strength. The second layer is preferably under compressive stress. A third layer may be formed on the second layer, which has a relatively low dielectric constant and relatively poor mechanical strength, and a fourth layer may be formed on the third layer, which has a relatively high dielectric constant and superior mechanical strength.

11 Claims, 2 Drawing Sheets

SEMICONDUCTOR DEVICE HAVING A LOW-K DIELECTRIC LAYER

This application is a division of Ser. No. 09/524,766 Mar. 14, 2000 U.S. Pat. No. 6,362,091.

FIELD OF THE INVENTION

The present invention relates to semiconductor devices having a low-k dielectric layer and a method for making such devices.

BACKGROUND OF THE INVENTION

Semiconductor devices include metal layers that are insulated from each other by dielectric layers. As device features shrink, reducing the distance between the metal layers, capacitance increases. To address this problem, insulating materials that have a relatively low dielectric constant (herein referred to as low-k dielectrics) are being used in place of silicon dioxide (and other materials that have a relatively high dielectric constant) to form the dielectric layer that separates the metal lines.

A material that may be used to form such a low-k dielectric layer is carbon doped oxide, which can be deposited using standard PECVD equipment. (Copending applications, Ser. Nos. 09/422,841 and 09/465,654, filed Oct. 21, 1999 and Dec. 17, 1999 respectively, each assigned to this application's assignee, describe semiconductor devices that include a carbon doped oxide dielectric layer.) Using this material instead of silicon dioxide to separate metal lines may yield a device having reduced propagation delay, cross-talk noise and power dissipation. Although carbon doped oxide is a promising low-k substitute for silicon dioxide, films formed from this material may be relatively brittle. As a consequence, such films' crack resistance may be poor. In addition, such films may suffer from unacceptable flaking and are prone to delamination. As a result, use of such brittle low-k films may be restricted to forming layers having a thickness that is well below their cracking threshold—perhaps limiting their use to forming films that are less than about 1 micron thick.

Accordingly, there is a need for a semiconductor device, which includes a low-k dielectric layer (e.g., one including a carbon doped oxide) that is less susceptible to cracking. There is also a need for an improved process for making such a semiconductor device. The present invention provides such a semiconductor device and a process for making it.

DETAILED DESCRIPTION OF THE PRESENT INVENTION

Figure 1A:
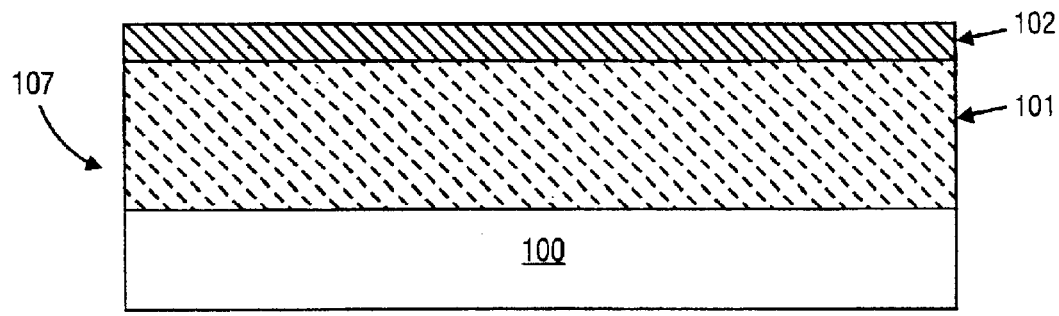
FIGS. 1a–1c are schematics of cross-sections of structures that may result when the method of the present invention is used to make a semiconductor device.

A semiconductor device having a low-k dielectric layer (i.e., a dielectric layer that has a dielectric constant that is less than about 3.5), and a process for making such a semiconductor device, is described. In one aspect of the present invention, the semiconductor device has a dielectric layer that comprises first and second insulating layers. The first insulating layer includes a carbon doped oxide. The second insulating layer is formed on the surface of the first insulating layer. The second insulating layer is under compressive stress and provides superior mechanical strength, when compared to the mechanical strength of the first insulating layer. Because it enhances the toughness of the resulting dielectric layer, and because it is under compressive stress, the second insulating layer ensures that the composite dielectric layer will have improved crack resistance. A third insulating layer, which like the first insulating layer includes a carbon doped oxide, may be formed on the second insulating layer.

In another aspect, the semiconductor device of the present invention has a dielectric layer made up of four separate layers. The first layer has a relatively low dielectric constant and relatively poor mechanical strength. The second layer, which is formed on the surface of the first layer, has a relatively high dielectric constant and superior mechanical strength. The third layer, which is formed on the surface of the second layer, has a relatively low dielectric constant and relatively poor mechanical strength, and the fourth layer, which is formed on the surface of the third layer, has a relatively high dielectric constant and superior mechanical strength. Such a semiconductor device may further include a dual damascene interconnect. To form such a device, the via and trench are etched through a dielectric layer that comprises layers of relatively thick low-k material that alternate with layers of relatively thin high strength material.

In one aspect, the method of the present invention comprises forming on a substrate a first insulating layer, which includes a carbon doped oxide. A second insulating layer is then formed on the surface of the first insulating layer. The second insulating layer is under compressive stress and provides superior mechanical strength, when compared to the mechanical strength of the first insulating layer. A third insulating layer, which also includes a carbon doped oxide, may then be formed on the surface of the second insulating layer.

In another aspect, the method of the present invention comprises forming on a substrate a first insulating layer, which has a relatively low dielectric constant and relatively poor mechanical strength. A second insulating layer, which has a relatively high dielectric constant and superior mechanical strength, is then formed on the surface of the first insulating layer. A third insulating layer, which has a relatively low dielectric constant and relatively poor mechanical strength, is then formed on the surface of the second insulating layer. A fourth insulating layer, which has a relatively high dielectric constant and superior mechanical strength, is then formed on the surface of the third insulating layer.

Set forth below is a description of a number of embodiments of the semiconductor device of the present invention, and a method for making it. That description is made with reference to FIGS. 1a–1c and FIGS. 2a–2c.

With reference to FIG. 1a, to make the semiconductor device of the present invention, first insulating layer 101 is formed on substrate 100. Substrate 100 may be any surface, generated when making a semiconductor device, upon which an insulating layer may be formed. Substrate 100 may include, for example, active and passive devices that are formed on a silicon wafer such as transistors, capacitors, resistors, diffused junctions, gate electrodes, local interconnects, etc. . . . Substrate 100 also may include insulating materials (e.g., silicon dioxide, either undoped or doped with phosphorus (PSG) or boron and phosphorus (BPSG); silicon nitride; silicon oxynitride; silicon carbide; carbon doped oxide; an organic containing silicon oxide; or a polymer) that separate such active and passive devices from conductive layers that are formed on top of them, and may include various types of conductive layers.

First insulating layer 101 comprises a low-k dielectric material, preferably a carbon doped oxide. Such a carbon-doped oxide may include between about 5 and about 50 atom % carbon. Although layer 101 preferably comprises a carbon doped oxide, it may alternatively comprise a low-k polymer (e.g., an organic polymer such as a polyimide, parylene, polyarylether, organo-silicone, polynaphthalene, polyquinoline, or copolymers thereof; an SOG material (e.g., HSG or MSG); or porous materials such as xerogels and others that include templated pores.

First insulating layer 101 may be formed using conventional deposition techniques, e.g., a conventional spin-on deposition process or plasma enhanced chemical vapor deposition ("PECVD"). When using a PECVD process to form a carbon doped oxide based insulating layer, gases that provide a source of silicon, oxygen, and carbon are fed into a PECVD reactor. Such a reactor may be operated at conventional temperatures (e.g., a temperature between about 0° C. and about 500° C.), pressures, RF and power, as will be apparent to those skilled in the art. First insulating layer 101 preferably has a thickness of between about 300 and about 3,000 nanometers. When insulating layer 101 comprises a carbon doped oxide, it may be desirable in some cases to cure that layer, after it is deposited, to outgas volatile species, e.g., water, hydrogen and loosely bonded organic components.

After depositing first insulating layer 101 on substrate 100, second insulating layer 102 is formed on that layer's surface to improve the mechanical strength of overall dielectric layer 107. Second insulating layer 102 has increased toughness, when compared to first insulating layer 101. In a preferred embodiment, layer 102 is formed on layer 101 such that the resulting layer 102 is under compressive stress.

When layer 101 comprises a carbon doped oxide, or other material that is under tensile stress, forming a compressive layer on the surface of layer 101 may counteract that tensile stress. By increasing the compressive stress of layer 102, using techniques that will be apparent to those skilled in the art, it may be possible to reduce the thickness of layer 102, while still enabling that layer to enhance the mechanical strength of overall dielectric layer 107. Reducing the thickness of layer 102 should reduce the effect that layer has on the dielectric constant of overall dielectric layer 107.

Second insulating layer 102 preferably comprises silicon dioxide. Forming a silicon dioxide layer on top of a low-k layer, e.g., a carbon doped oxide layer, may produce an overall dielectric layer that has a relatively low dielectric constant and acceptable mechanical strength. Although second insulating layer 102 preferably comprises silicon dioxide, other materials that can impart enhanced toughness to the overall dielectric layer may be used instead. Examples of materials that may provide that property include SiOF, silicon nitride, silicon oxynitride, and silicon carbide.

Although a few examples of the materials that may form second insulating layer 102 are described here, many others may be used. Like layer 101, layer 102 may be formed using a conventional PECVD process. When layer 102 comprises silicon dioxide, either tetraethylorthosilicate ("TEOS") or silane may be used to form that layer, as is well known to those skilled in the art. Second insulating layer 102 preferably has a thickness of between about 2 and about 300 nanometers. Layer 102 should be thick enough to provide the requisite toughness to the overall dielectric layer, but be thin enough to ensure that it does not significantly raise the overall composite layer's dielectric constant.

Figure 1B:
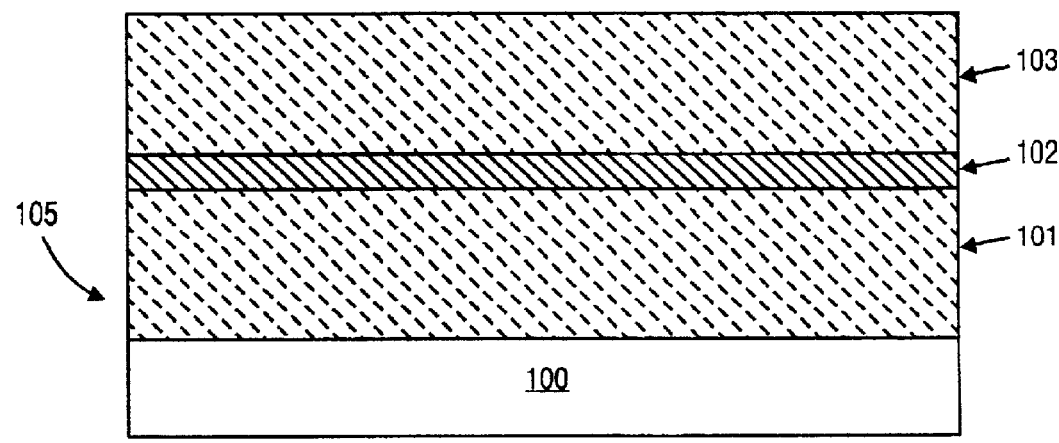

After forming second insulating layer 102, third insulating layer 103 may be deposited on top of it, as shown in FIG. 1b. Like first insulating layer 101, third insulating layer 103 preferably comprises a carbon doped oxide. The same process steps, materials and equipment used to form first insulating layer 101 may be used to form third insulating layer 103. When forming such a three layer dielectric layer, first and third insulating layers 101, 103 preferably should each be between about 150 and about 1,500 nanometers thick. In the resulting structure, layer 102, which preferably is under compressive stress, strengthens overall dielectric layer 105 in a manner similar to how steel rods strengthen concrete.

Figure 1C:
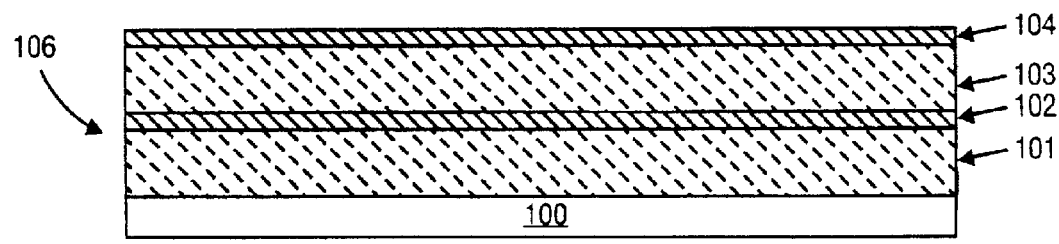

After third insulating layer 103 is deposited, fourth insulating layer 104 may be formed on the surface of that layer, as shown in FIG. 1c, to provide further mechanical strength to the resulting structure. The same process steps, materials and equipment used to form second insulating layer 102 may be used to form fourth insulating layer 104. Like second insulating layer 102, fourth insulating layer 104 preferably should be under compressive stress and be between about 2 and about 300 nanometers thick. Although layers 101 and 103 preferably comprise the same type of low-k material, they may be formed from different low-k materials. Similarly, although layers 102 and 104 preferably comprise the same type of mechanically strong material, they may be formed from different materials that have that property.

Following the formation of the resulting composite dielectric layer 106, conventional photolithography and etching processes may be applied to generate etched regions, e.g. vias and/or trenches, for forming contacts, single damascene interconnects, dual damascene interconnects, or other types of interconnects. Such etched regions may be filled with tungsten, copper, copper alloy, aluminum, aluminum alloy, or another conductive material, as is well known to those skilled in the art.

Figure 2A:
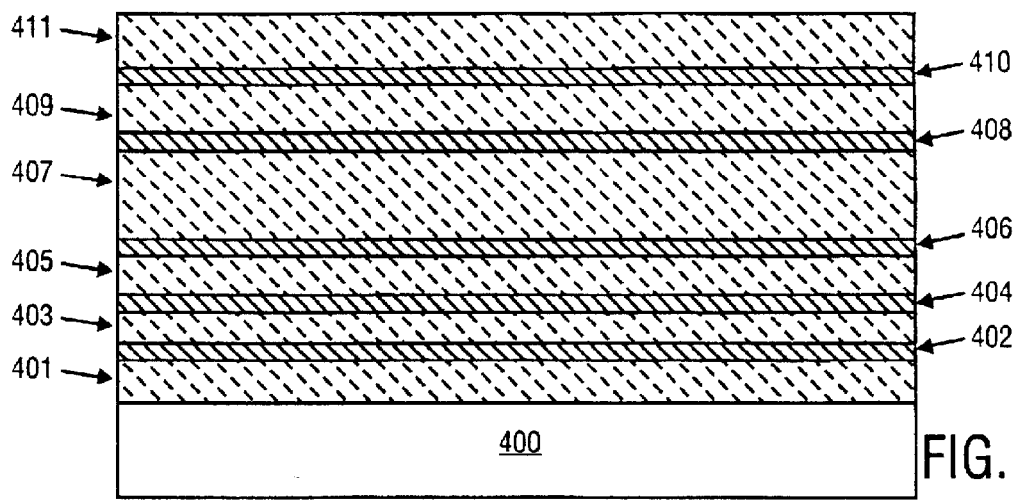
FIGS. 2a–2c are schematics of cross-sections of structures that may result when the method of the present invention is used to make a semiconductor device that has a dual damascene interconnect.
Figure 2B:
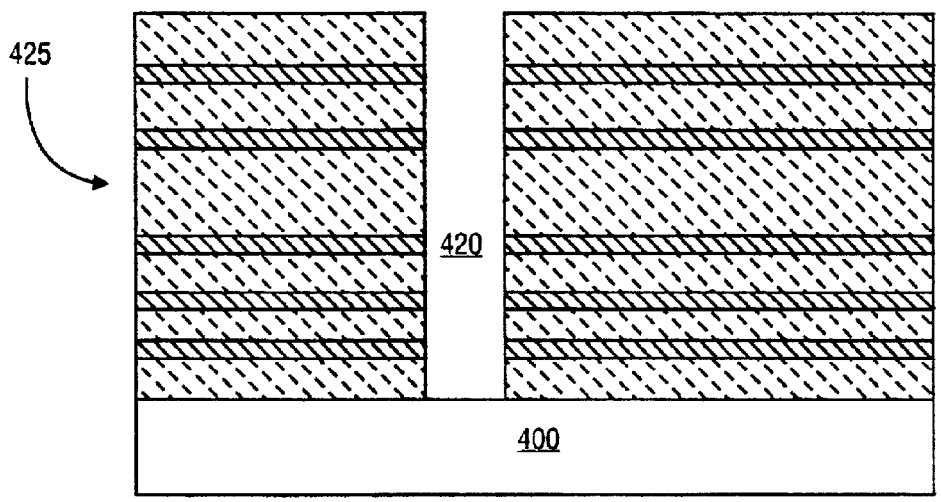
Figure 2C:
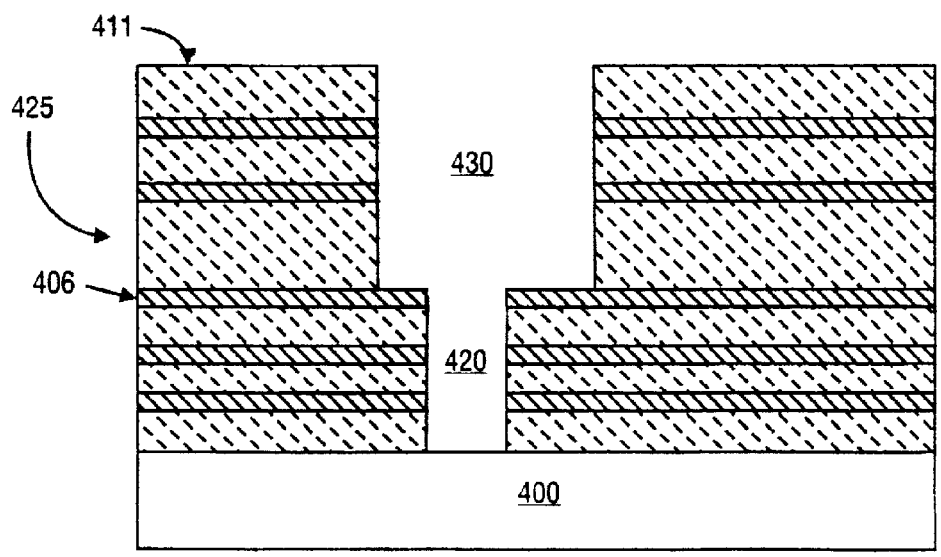

FIGS. 2a–2c illustrate how the method of the present invention may be used to make a semiconductor device that has a dual damascene interconnect, which includes a dielectric layer that has a relatively low dielectric constant and acceptable crack resistance. In this embodiment, alternating layers of low-k material and high strength material are deposited on a substrate until the desired thickness for the overall dielectric layer is reached. This process may produce a structure like the one shown in FIG. 2a, in which alternating low-k insulating layers 401, 403, 405, 407, 409, and 411, and high strength insulating layers 402, 404, 406, 408, and 410 are formed on substrate 400. Note that in this embodiment the thickness of the low-k insulating layers varies—the layers through which the via will be formed being thinner than those through which the trench will be formed.

FIG. 2b shows the structure that results after via 420 is etched through overall composite dielectric layer 425. Via 420 may be etched through layer 425 using conventional equipment, materials, and process steps. Next, trench 430 is etched into layer 425, forming the structure shown in FIG. 2c. In this embodiment, trench 430 is etched down to high strength layer 406, preferably made of silicon dioxide. Trench 430, like via 420, may be etched through layer 425 using conventional equipment, materials, and process steps. Subsequent process steps may then follow, e.g., filling via 420 and trench 430 with a conductive material and applying a conventional chemical mechanical polishing step to remove that material from the surface of layer 411. Additional dielectric layers, into which additional dual damascene interconnects are formed, may be deposited on layer 411 when making a semiconductor device, as will be apparent to those skilled in the art.

In the embodiment shown in FIGS. 2a–2c, overall composite dielectric layer 425 includes six low-k insulating layers that are formed in alternate fashion with five insulating layers, which enhance layer 425's mechanical properties. Overall composite dielectric layer 425 may, however, include more or less than the 11 layers shown here without departing from the spirit and scope of the present invention. The number of layers formed may depend upon the type of material used to form the low-k layers, and the mechanical properties that the overall dielectric layer requires. In addition, although this embodiment shows alternating layers adjacent to both via 420 and trench 430, such layers may instead be formed adjacent to via 420 only, or adjacent to trench 430 only. Overall composite dielectric layer 425 may be between about 300 and about 3,000 nanometers thick.

In a preferred embodiment of the device shown in FIG. 2c, each layer 401, 403, 405, 407, 409, and 411, preferably is between about 150 and about 1,500 nanometers thick. Each layer 402, 404, 406, 408, and 410 preferably is between about 2 and about 100 nanometers thick, and more preferably between about 10 and about 50 nanometers thick. In this embodiment, depending upon the material used for the low-k layers, dielectric layer 425 may exhibit acceptable crack resistance, even if the total thickness of the high strength layers is less than about 5% of the total thickness of dielectric layer 425. In this regard, the amount of separation between mechanically strong layers (i.e., the thickness of the low-k layer that separates them) that best balances the overall dielectric layer's dielectric constant with its mechanical properties may depend upon the mechanical strength of the low-k material chosen to form the layer that separates those mechanically strong layers. In a preferred embodiment, the material chosen for high strength layers 402, 404, 406, 408, and 410 may also enable one or more of those layers to serve as a hard mask, etch stop, and/or polish stop layer.

By forming a dielectric layer that comprises relatively thick low-k layers which alternate with relatively thin mechanically strong layers, the resulting overall dielectric layer may exhibit the toughness that many applications require. Consequently, when the mechanically strong layers comprise silicon dioxide (or another material having favorable mechanical properties), the resulting semiconductor device may show acceptable crack resistance—even though the bulk of the dielectric layer comprises a carbon doped oxide, or another low-k material. By making the mechanically strong layers relatively thin, adding them to form such a composite dielectric layer should not significantly affect that layer's dielectric constant.

The improved method of the present invention enables use of carbon doped oxide, or another relatively brittle low-k material, to make semiconductor devices that have acceptable crack resistance. This process enables the production of a semiconductor device that has a low-k dielectric layer, which should improve the device's RC characteristics, that provides satisfactory mechanical strength.

Although the foregoing description has specified certain steps, materials, and equipment that may be used in such a method to make such a device, those skilled in the art will appreciate that many modifications and substitutions may be made. In addition, although the dielectric layer described above forms part of a semiconductor device, such a dielectric layer may be used to make other types of devices. Accordingly, it is intended that all such modifications, alterations, substitutions and additions be considered to fall within the spirit and scope of the invention as defined by the appended claims.

What is claimed is:

1. A semiconductor device having a dielectric layer that comprises:
    a first insulating layer, which includes a carbon doped oxide; arid
    a second insulating layer, formed on the surface of the first insulating layer, that is under compressive stress and that provides superior mechanical strength, when compared to the mechanical strength of the first insulating layer.

2. The semiconductor device of claim 1 further comprising a third insulating layer, which includes a carbon doped oxide, formed on the surface of the second insulating layer.

3. The semiconductor device of claim 2 wherein the first and third insulating layers each consist essentially of a carbon doped oxide, and the second insulating layer comprises a material selected from the group consisting of silicon dioxide, SiOP, silicon nitride, silicon oxynitride, and silicon carbide.

4. The semiconductor device of claim 3 wherein the carbon doped oxide included in both the first and third insulating layers includes between about 5 and about 50 atom % carbon.

5. The semiconductor device of claim 2 wherein the first and third insulating layers are each between about 150 and about 1,500 nanometers thick, and the second insulating layer is between about 2 and about 100 nanometers thick.

6. A semiconductor device having a dielectric layer that comprises:
    a first insulating layer, which includes a carbon doped oxide;
    a second insulating layer comprising silicon dioxide, which is formed on the surface of the first insulating layer;
    a third insulating layer, which includes a carbon doped oxide, that is formed on the surface of the second insulating layer; and
    a fourth insulating layer comprising silicon dioxide, which is formed on the surface of the third insulating layer.

7. The method of claim 6 wherein the first and third insulating layers are each between about 150 and about 1,500 nanometers thick and the second and fourth insulating layers are each under compressive stress and are each between about 2 and about 100 nanometers thick.

8. The method of claim 7 wherein the first and third insulating layers each consist essentially of a carbon doped oxide that includes between about 5 and about 50 atom % carbon.

9. A semiconductor device having a dielectric layer that comprises:
    a first insulating layer, which has a relatively low dielectric constant and relatively poor mechanical strength, that is between about 150 and about 1,500 nanometers thick;
    a second insulating layer, which is formed on the surface of the first insulating layer, that has a relatively high dielectric constant and superior mechanical strength and that is between about 2 and about 100 nanometers thick;

a third insulating layer, which is formed on the surface of the second insulating layer, that has a relatively low dielectric constant and relatively poor mechanical strength and that is between about 150 and about 1,500 nanometers thick; and a fourth insulating layer, which is formed on the surface of the third insulating layer, that has a relatively high dielectric constant and superior mechanical strength and that is between about 2 and about 100 nanometers thick.

10. The semiconductor device of claim 9 further comprising a dual damascene interconnect, in which a via has been etched through the first, second, third and fourth insulating layers, and in which a trench has been etched through the third and fourth insulating layers.

11. The semiconductor device of claim 10 wherein the second and fourth insulating layers are each under compressive stress.

* * * * *

UNITED STATES PATENT AND TRADEMARK OFFICE
CERTIFICATE OF CORRECTION

PATENT NO. : 6,914,335 B2
DATED : July 5, 2005
INVENTOR(S) : Andideh et al.

It is certified that error appears in the above-identified patent and that said Letters Patent is hereby corrected as shown below:

Column 6,
Line 13, delete "arid" and insert -- and --.
Line 26, delete "SiOP," and insert -- SiOF, --.

Signed and Sealed this

Third Day of January, 2006

JON W. DUDAS
*Director of the United States Patent and Trademark Office*